United States Patent [19]

Blondeau et al.

[11] Patent Number: 5,424,242
[45] Date of Patent: Jun. 13, 1995

[54] METHOD FOR MAKING AN OPTOELECTRONIC AMPLIFIER DEVICE, AND APPLICATIONS TO VARIOUS OPTOELECTRONIC

[75] Inventors: Robert Blondeau, Ablis; Yannick Bourbin, Chatenay Malabry; Daniel Rondi, Orsay, all of France

[73] Assignee: Thomson-CSF, Puteaux, France

[21] Appl. No.: 53,809

[22] Filed: Apr. 29, 1993

Related U.S. Application Data

[63] Continuation of Ser. No. 630,891, Dec. 20, 1990, abandoned.

[30] Foreign Application Priority Data

Dec. 22, 1989 [FR] France .................. 89 17087

[51] Int. Cl.⁶ .............................. H01L 21/20
[52] U.S. Cl. ............................ 437/129; 437/133; 148/DIG. 95
[58] Field of Search ............ 437/129, 2, 126, 133; 359/333

[56] References Cited

U.S. PATENT DOCUMENTS

| | | | |
|---|---|---|---|
| 4,054,363 | 10/1977 | Suematsu | 437/129 |
| 4,114,257 | 9/1978 | Bellavance | 437/129 |
| 4,378,255 | 3/1983 | Holenyak, Jr. et al. | 437/129 |
| 4,511,408 | 4/1985 | Holonyak, Jr. | 437/129 |
| 4,901,321 | 2/1990 | Blondean et al. | 372/7 |
| 5,288,659 | 2/1994 | Koch et al. | 437/133 |

FOREIGN PATENT DOCUMENTS

| | | |
|---|---|---|
| 0178497 | 9/1985 | European Pat. Off. . |
| 0240400 | 10/1987 | European Pat. Off. . |
| 2596529 | 10/1987 | France . |
| 8411 | 7/1990 | WIPO . |

OTHER PUBLICATIONS

Electronics Letters, vol. 25, No. 16, Title "Polarisation-independent optical amplifier with buried facets" p. 1048 N. A. Olsson et al, 3 Aug. 1989.

Electronics Letters, vol. 24, No. 20, Sep. 29, 1988; pp. 1275–1276, Title "1.3 mum GaInAsp near-travelling-wave laser amplifiers made by combination of angled facets and antireflection coatings", C. E. Zah et al.

Applied Physics Letters, vol. 51, No. 20, Nov. 16, 1987, pp. 1577–1579, Title "Optical amplification by monolithically integrated distributed-feedback lasers", H. Inoue et al.

*Primary Examiner*—Robert Kunemund
*Assistant Examiner*—Linda J. Fleck
*Attorney, Agent, or Firm*—Oblon, Spivak, McClelland, Maier & Neustadt

[57] ABSTRACT

A method for making an optical amplifier according to which a stack of the following layers is made by epitaxy: a first optical guiding layer; a first chemical attack barrier layer; a second optical guiding layer; a second chemical attack barrier layer; an active layer; a confinement layer; and a contact layer. Then at least one amplifier element followed by an optical guide located beneath this amplifier element are etched in these layers. The method can be applied to the making of optoelectronic devices such as modulators, change-over switches, distributors, etc.

9 Claims, 3 Drawing Sheets

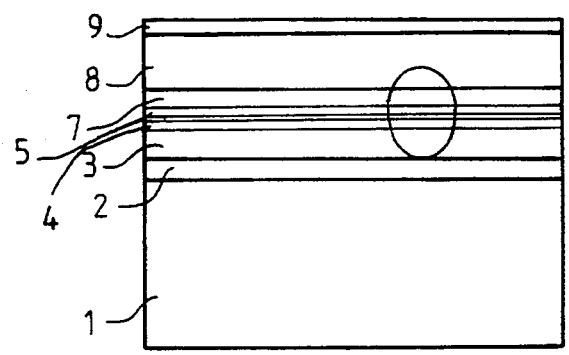
FIG_1-a
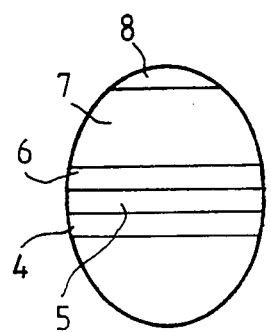
FIG_1-b
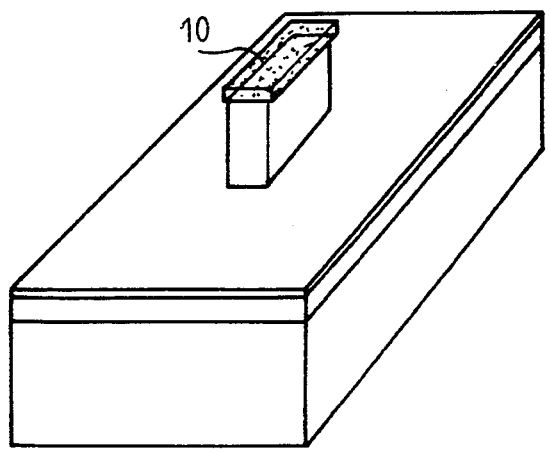
FIG_2
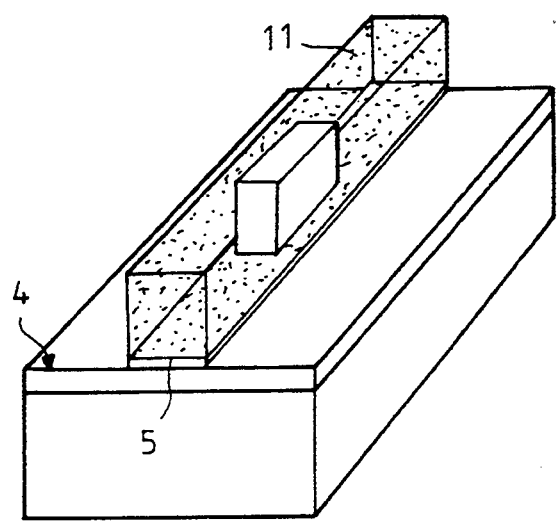
FIG_3

FIG_4
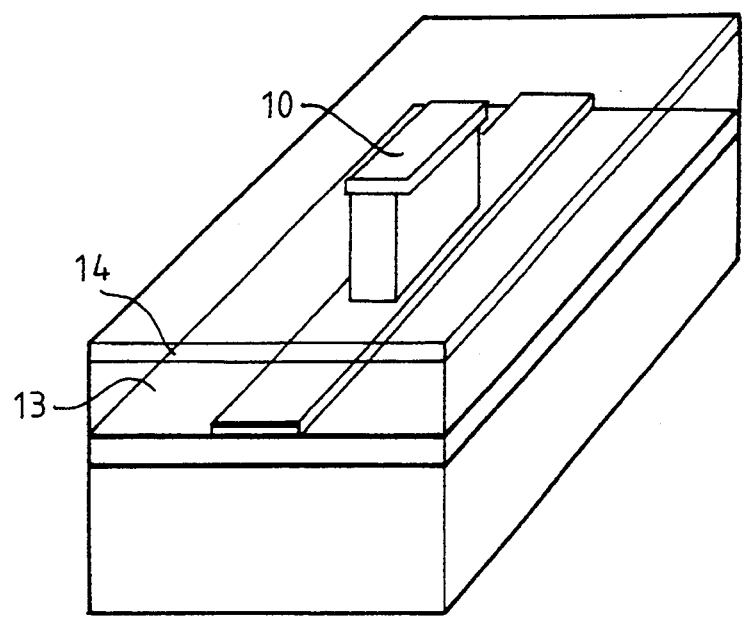
FIG_5
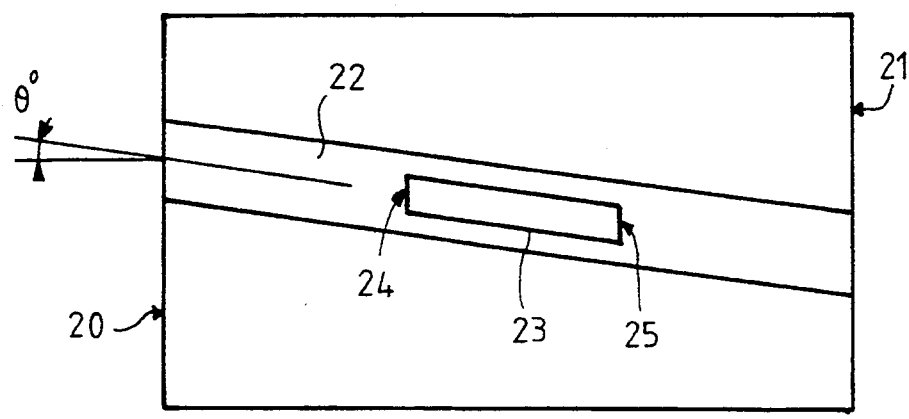

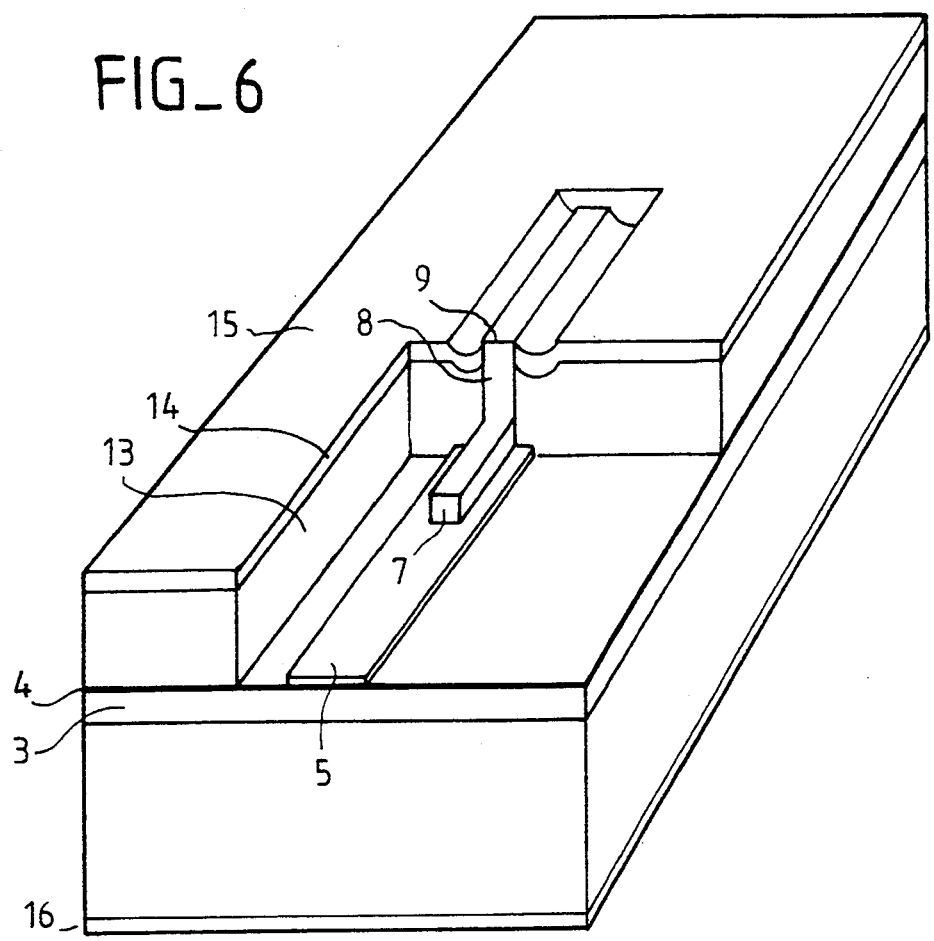
FIG_6
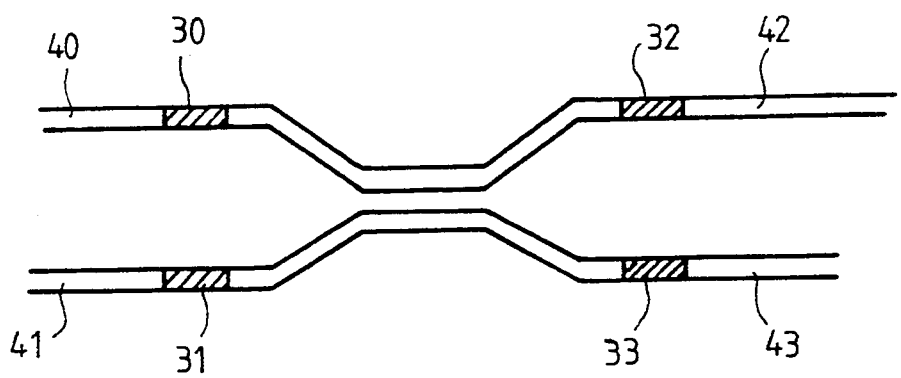
FIG_7
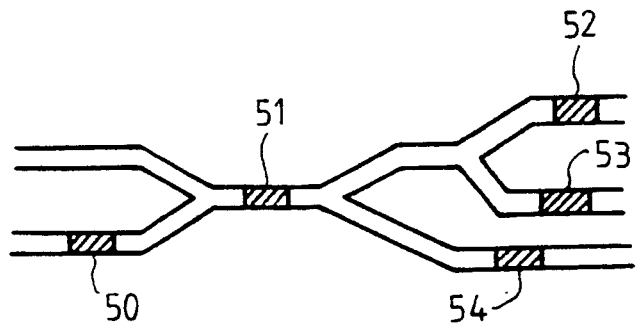
FIG_8

METHOD FOR MAKING AN OPTOELECTRONIC AMPLIFIER DEVICE, AND APPLICATIONS TO VARIOUS OPTOELECTRONIC

This is a Continuation of application Ser. No. 07/630,891, filed on Dec. 20, 1990, now abandoned.

BACKGROUND OF THE INVENTION

1. Field of the Invention

The invention relates to a method for making an optoelectronic amplifier device, and a device obtained by this method. In particular, it relates to a device including an optical amplifier monolithically integrated with a waveguide, as well as to its manufacturing method. It also relates to the application of an amplifier such as this to optoelectronic devices such as change-over switches, modulators and distributors.

2. Description of the Prior Art

For the past few years, an increasing amount of research has been devoted to optical amplifiers, made either on doped optical fibers or on semiconductor materials.

As for semiconductor optical amplifiers, several applications are envisaged for telecommunications by optical fibers. These amplifiers could be used:

either at transmission, as boosters, or in line to advantageously replace standard repeaters and thus increase the range of the link;

or again at reception as preamplifiers.

However, one of the most promising applications relates to the monolithic integration of amplifiers with other functions in optics, such as those performed by modulators, change-over switches and distributors. These amplifiers would thus enable compensation for insertion losses and make it possible to set up very complex devices with limited or even zero losses.

One of the major problems with respect to the manufacture of optical amplifiers, whether discrete or integrated, is that of obtaining very low reflection coefficients at the output faces of the amplifiers, in order to avoid a resonant type behavior related to the Fabry-Perot cavity formed by these output faces. Up until now, one of the methods used to obtain low reflection coefficients has been to make anti-reflection dielectric layers that are difficult to control and have little reproducibility.

The following documents describe an approach that enables a reduction in the reflection at the output faces by the making of "window" type structures.

N. A. OLSSON et al.: "Polarization Independent Optical Amplifier With Buried Facets", Electronics Letters, Vol. 25, No. 16, p. 1048–1049, Aug. 3, 1989.

I. CHA et a.: "1.5 Band Travelling Wave Semiconductor With Window Facet Structure", I00C'89 (Proceedings), Jul. 18–21, 1989, Kobe, Japan.

With regard to the integration of an optical amplifier with other optical functions, a recent example consisting of the monolithic integration of three DFB (distributed feed-back) lasers, a multiplexer and an amplifier at output has been described in the following document:

U. KOREN et al.: "An Integrated Tunable Light Source with Extended Tunable Range", I00C'89 (Proceedings), Jul. 18–21, 1989, Kobe, Japan.

The invention relates to a structure including an optical amplifier integrated with a passive waveguide. This structure has made it possible to obtain a fiber-to-fiber gain of the order of 3 to 4 dB, thus demonstrating its potentiel for the making of devices with compensated losses.

Furthermore, this structure has the advantage, in addition to the monolithic integration of two optical functions, of making it possible to obtain very low reflection coefficients at the output faces. For, the structure forming the passive waveguide may be optimized so as to considerably reduce the modal reflection coefficient.

Furthermore, the invention relates to a method for making a new and more promising structure that makes use of the localized epitaxy of semi-insulator layers by MOCVD.

To achieve these results, the invention relates to a method for making an optoelectronic amplifier device comprising the following steps:

a) a stage for the epitaxy, on a substrate, of the following layers:

an optical confinement layer;

a first optical guiding layer made of a material transparent to the wavelength to be amplified;

a first chemical attack barrier layer;

a second optical guiding layer;

an active layer, the material of which has a maximum gain curve for the energy of the wave to be amplified;

an optical confinement layer;

a contact layer.

b) A first step for etching at least one amplifier element in the active layer, the confinement layer and the contact layer;

c) a second step for etching at least one optical guide located beneath the amplifier element, this etching being done in the second optical guiding layer;

d) a step for the deposition of a semi-insulator material on the structure;

e) a step for making an electrical contact on the upper part of the contact layer.

The invention also relates to an optical amplifier comprising a waveguide with a forbidden band width greater than the energy of the wave to be amplified as well as a small-sized amplifier element, located on a zone of the waveguide and made of a material for which the maximum value of the gain curve corresponds to the energy of the wave propagated.

Finally, the invention relates to the application of the method to the making of optoelectronic devices.

In particular, it relates to a method for making a modulator applying the above method, the method comprising, before the step for the deposition of the semi-insulator material on the structure, a step for the making of at least one electrode and means for setting up electrical connections to this electrode so as to enable the application of an electrical field to the waveguide.

The invention also relates to a method for making a change-over switch which also implements the above method, the method comprising the making of at least two waveguides including coupling portions and the making, in these coupling portions, of electrodes enabling the application of an electrical field, an amplifier elements being made on at least one of the waveguides.

The invention also relates to a method for making a distributor that also applies the above method, the method comprising the making of several waveguides arranged in a "Y" shape, it being possible to make an amplifier element on each arm of the "Y".

BRIEF DESCRIPTION OF THE DRAWINGS

The different objects and characteristics of the invention will appear in the following description and in the appended figures, of which:

FIGS. 1 to 4 shows different steps of the method according to the invention;

FIG. 5 shows a top view of the device according to the invention;

FIG. 6 shows a partially cutaway view in perspective of the device according to the invention.

FIGS. 7 and 8 exemplify applications of the invention to the making of optoelectronic devices.

DETAILED DESCRIPTION OF THE INVENTION

With respect to integration, the basic idea of the invention consists essentially in the addition, to a predefined guide, of one or more layers having compositions adapted so as to form a guide structure with a composite core. To implement this idea, the invention relates to a method for making a structure such as this.

The different steps of this manufacturing method are described hereinafter with reference to FIGS. 1 to 4.

A first epitaxy is carried out on a substrate 1 made of N type InP and having the following layers:

a confinement layer 2 made of InP with N type doping and a thickness $e_2$, a guiding layer 3, with a thickness $e_3$, adapted in its composition so that, with the other layers, it forms a waveguide transparent to the wavelength of propagation (for example $\lambda_g(3)$ 1.3 $\mu$m for a guided wavelength of $\lambda = 1.5$ $\mu$m). The material of this layer should therefore have a forbidden band width greater than the energy of the propagated wave (to be amplified), a chemical attack barrier layer 4 made of InP and having a thickness $e_4$ which may be very small (10 nm), a guiding layer 5 with a thickness $e_5$ which may be very small (20 nm) and which will be used for the lateral confinement after the etching of a strip. As the case may be, the composition of this layer will be similar to that of the layer 3. It is important to note that the guide formed by the etching of a strip in this layer will be a guide with a low index transition ($-10^{-3}$) as described in the French patent application 86 04523. As is disclosed in this French patent application, lattice parameters of the optical guiding element 5 may be matched to that of the barrier layer 4, and guiding layer 5 may be made of gallium and indium arsenide (Ga In As) or of gallium and indium arsenide phosphide (Ga In As P). As a further possibility, guiding layer 5 may be formed of several sublayers, which may comprise a sublayer of optical guiding material and then an etching barrier sublayer, and then alternating sublayers of optical guiding material and etching barrier layers. Such various sublayers may have materials whose lattice parameters are matched to the lattice parameters of adjacent sublayers. Further, the etching barrier sublayers in such a device may be formed with the same material as the barrier layer 4. Further, the optical guiding sublayers may be formed of the same material as the above-described guiding layer 5. This French patent application also discloses that guiding layer 5 may have a forbidden bandwidth of 0.8 eV.

a second chemical attack barrier layer 6, with a thickness $e_6$ which may be very small (10 nm).

a guiding layer 7 with a thickness $e_7$ used for amplification and having a composition adapted to the propagation wavelength, i.e. in this case $\lambda_g(7) = 1.5$ $\mu$m. More precisely, the material of this active layer 7 is chosen so that the maximum of the gain curve corresponds to the energy of the wave to be amplified.

a confinement layer 8, with a thickness $e_8$, made of a P type material which may be InP or a quaternary material with a composition corresponding to a smaller wavelength than that of propagation (for example $\lambda_g(8) = 1.3$ and 1.1 $\mu$m).

finally, a $p^+$ doped contact layer 9 with a thickness $e_9$.

At the end of the epitaxy of these different layers on the substrate 1, we obtain a structure such as the one shown in FIG. 1a. FIG. 1b shows an enlarged detail of the guiding layer 5 and the chemical attack barrier layers of this structure shown in FIG. 1a.

Then, as shown in FIG. 2, an element is etched so as to demarcate the active zone of an amplifier element. To this end, a dielectric mask 10 is made. The dimensions of this mask 10 determine the dimensions of the amplifier element, and the etching is done in the above-described layers 7 and 9 up to the barrier layer 6. The width of the strip obtained is chosen so as to preserve a single-mode guide. In our exemplary embodiment, it will have a width of about one micrometer for a length of about 500 micrometers.

Then, as shown in FIG. 3, an etching operation is carried out on a waveguide located beneath the previously etched amplifier element. To this end, a resin mask 11 is made. This resin mask 11 has the dimensions of the waveguide to be obtained and encloses the above amplifier element. It must be noted that the above dielectric mask 10 is kept during this stage. The waveguide is thus etched in the layers 5 and 6, by using selective chemical attack up to the chemical attack barrier layer 4.

The width of the waveguide is optimized so that the waveguide obtained is a single-mode guide.

During a following step, the entire structure is then buried to enable operation and to cause the electrical injection, needed for operation, to be localized in the amplification zone alone. This step is achieved by epitaxy in keeping the dielectric mask 10 that was used to etch the strip of the amplifier, and comprises the making of two layers 13 and 14 out of InP material. The layer 13 is a semi-insulator type layer (iron-doped for InP) and the second layer 14 is $N^+$ doped. This layer 14 has the role of blocking any possible diffusion of dopant impurities in the semi-insulator layer during the making of the ohmic contact.

Finally, after removal of the dielectric mask 10, the deposits of ohmic contacts 15 and 16 are made. It must be noted that the upper ohmic contact 15 may be localized on the amplifier zone alone.

Furthermore, as stated previously, this structure enables a very low modal reflection coefficient to be obtained at the cleaved faces, provided that, to achieve this, as shown in FIG. 5, the axes of the optical guide 22 and of the amplifier element 23 are inclined with respect to the perpendicular to the faces 20 and 21.

An estimation of this reflection coefficient has been made for this structure and, for example for an angle of 4°, the reflection coefficient is of the order of $10^{-4}$ which is already difficult to obtain by standard anti-reflection treatment.

The inclination of the axis of the optical guide 22 and of the amplifier element 23, by an angle θ for example, is obtained by inclining the masks 10 and then 11 with respect to the cleaved faces 20 and 21 during the preceding etching operations.

Furthermore, according to the invention, it is provided that the faces 24 and 25 of the amplifier element 23 are also inclined with respect to the axis of the amplifier element. Preferably, these faces 24 and 25 are parallel to the cleaved faces 20 and 21. This is obtained by making the mask 10 with an appropriate shape as shown in the view of FIG. 5.

According to one variant of the manufacturing method, the guiding layers 3 and 5 as well as the active layer 7 are made in the form of different alternating layers so as to form multiple quantum wells.

The device obtained by the method of the invention takes the form shown in FIG. 6.

This device has a waveguide on a substrate 1. This waveguide is constituted by the guiding layer or band 5 and the layer 2. These two layers are separated by the chemical attack barrier layer 4.

The material constituting the layers of this guide should have a forbidden band width greater than the energy of the wave propagated.

An amplification element 7 is located on the waveguide thus formed. This amplification element 7 is made of a material having a maximum of its gain curve adapted to the wavelength to be amplified.

The amplification element 7 bears a layer 8 made of a material, such as P doped InP, enabling an injection of electrical current.

The entire structure is buried in a layer 13 of a semi-insulator material.

The upper face of the layer 8 is provided with an ohmic contact layer 9.

Finally, the substrate 1 has an ohmic contact layer 16 enabling an electrical control of the structure.

In accordance with the variant of the above-described manufacturing method, the guiding layers 3 and 5 as well as the active layer 7 take the form of alternating layers of different materials so as to form multiple quantum wells.

The method of the invention can be applied to an amplifier, the amplifier element of which has a DFB (distributed feed-back) structure. To this end, after making an active layer 7, a distributed feed-back grating is made on the upper surface of the active layer by any means known in the state of the art. The method then continues as described here above.

The method of the invention also enables the making of a modulator in providing for the setting up, before the deposition of the material of the layers 13 and 14, of at least one electrode and of electrical connections for the application of an electrical field to the structure.

In the same way, the method of the invention can be applied to the making of change-over switches. To this end, several waveguides can be made on the substrate so that they have coupling zones enabling the coupling of the waveguides to one another. Electrodes are made in these coupling zones according to known techniques, and enable a light beam to be switched over from one waveguide to another one. Thus there is obtained a change-over switch on which it is possible, as shown schematically in FIG. 7, to have different amplifiers 30, 31, 32, 33 on different arms 40, 41, 42, 43 of the change-over switch.

Finally, the method of the invention can also be applied to the making of a distributor according to which several optical guides are interconnected as shown in FIG. 8. Different waveguide sections may be provided with amplifier elements 50 to 54 made according to the method of the invention as described here above.

In short, we propose a novel structure that enables the integration of an amplifier with a waveguide and, by virtue of this very fact, opens up the way to the integration of more complex components.

The structure according to the invention can be made with different types of semiconductor materials, especially III–V compounds and their solid solutions such as GaInAs, GaAlAs, GaInAlAs, GaInAsSb etc.

What is claimed is:

1. A method for making an optoelectronic amplifier comprising the steps of:
    forming a first optical confinement layer on a substrate;
    forming a first optical guiding layer made of a material transparent to a wave to be amplified on the first optical confinement layer;
    forming a first chemical attack barrier layer on the first optical guiding layer;
    forming a second optical guiding layer on the first chemical attack barrier layer;
    forming an active layer made of a material which has a maximum gain curve for an energy of the wave to be amplified on the second optical guiding layer;
    forming a second optical confinement layer on the active layer;
    forming a contact layer on the second optical confinement layer;
    first selectively etching a portion of the contact layer, the second optical confinement layer and the active layer to form at least one amplifier element; and
    second selectively etching a portion of the second optical guiding layer to form at least one optical guide beneath the at least one amplifier element, thereby forming a resulting structure.

2. The method according to claim 1, further comprising the further steps of:
    depositing a semi-insulating material over the resulting structure; and
    forming an electrical contact on an upper part of a remaining portion of the active layer.

3. The method according to claim 1, further comprising the step of forming a second chemical attack barrier layer between the second optical guiding layer and the active layer and wherein, during the second selective etching step, this second chemical attack barrier layer is also etched.

4. The method according to claim 1, further comprising the step of, after forming the active layer, forming a distributed feed-back structure on the upper surface of the active layer.

5. The method according to claim 2, wherein the step of depositing a semi-insulating material includes depositing a layer of a material for blocking impurities on the semi-insulating material.

6. A method according to claim 1, wherein the first optical guiding layer, the second optical guiding and the active layer are made in the form of alternating layers forming multiple quantum wells.

7. The method according to claim 2, further comprising the step of, before the step of depositing the semi-insulating material on the resulting structure, forming, on the resulting structure, at least one electrode with means for setting up electrical connections to this at least one electrode so as to enable the application of an electrical field to the at least one electrode, to thereby form a modulator.

8. The method according to claim 1, wherein at least two optical guides are formed, and further forming a coupling portion between the at least two optical guides and forming, in these coupling portions, electrodes enabling the application of an electrical field, an amplifier element being formed on at least one of the at least two optical guides, to thereby form a change-over switch.

9. The method according to claim 1, further comprising forming several optical guides arranged in a "Y" shape, and forming an amplifier element on each arm of the "Y", to thereby form a distributor.

* * * * *

UNITED STATES PATENT AND TRADEMARK OFFICE
CERTIFICATE OF CORRECTION

PATENT NO.   : 5,424,242
DATED        : June 13, 1995
INVENTOR(S)  : Robert BLONDEAU, et al.

It is certified that error appears in the above-indentified patent and that said Letters Patent is hereby corrected as shown below:

On the title page, Item [54], and Column 1, Lines 2-4, the title should read:

--METHOD FOR MAKING AN OPTOELECTRONIC AMPLIFIER DEVICE, AND APPLICATIONS TO VARIOUS OPTOELECTRONIC DEVICES--

Signed and Sealed this

First Day of August, 1995

Attest:

BRUCE LEHMAN

*Attesting Officer*   *Commissioner of Patents and Trademarks*